United States Patent
Goza

(10) Patent No.: US 8,446,723 B2
(45) Date of Patent: May 21, 2013

(54) WALL MOUNTED MODULAR WORKSTATION SYSTEM AND METHOD

(76) Inventor: Roger Goza, Tomball, TX (US)

(*) Notice: Subject to any disclaimer, the term of this patent is extended or adjusted under 35 U.S.C. 154(b) by 379 days.

(21) Appl. No.: 12/942,893

(22) Filed: Nov. 9, 2010

(65) Prior Publication Data

US 2011/0110026 A1 May 12, 2011

Related U.S. Application Data

(60) Provisional application No. 61/259,366, filed on Nov. 9, 2009.

(51) Int. Cl.
- *H05K 7/20* (2006.01)
- *H05K 5/00* (2006.01)
- *H05K 7/00* (2006.01)
- *B23P 17/04* (2006.01)
- *H01S 4/00* (2006.01)

(52) U.S. Cl.
USPC ...... 361/692; 361/679.41; 361/729; 361/730; 361/735; 361/747; 29/592; 29/592.1

(58) Field of Classification Search
USPC ............ 361/679.02, 679.08, 679.15, 679.41, 361/679.6, 692, 724–726, 728–730, 732, 361/733, 735, 747, 797, 807, 809, 810; 29/592, 29/592.1
See application file for complete search history.

(56) References Cited

U.S. PATENT DOCUMENTS

| | | | |
|---|---|---|---|
| 5,602,721 A * | 2/1997 | Slade et al. | 361/727 |
| D435,361 S | 12/2000 | Goza | |
| D435,362 S | 12/2000 | Goza | |
| D440,424 S | 4/2001 | Goza | |
| 7,009,840 B2 * | 3/2006 | Clark et al. | 361/679.41 |
| 7,178,469 B2 | 2/2007 | Goza | |
| D600,045 S | 9/2009 | Goza | |
| 2004/0027808 A1 * | 2/2004 | Rumney | 361/724 |
| 2004/0032102 A1 * | 2/2004 | Safari et al. | 280/47.26 |
| 2006/0158866 A1 * | 7/2006 | Peterson et al. | 361/796 |
| 2007/0069614 A1 * | 3/2007 | Waugh et al. | 312/245 |
| 2008/0168930 A1 * | 7/2008 | Calero | 108/50.02 |
| 2008/0188988 A1 * | 8/2008 | Goza | 700/275 |
| 2008/0189779 A1 * | 8/2008 | Goza | 726/9 |
| 2008/0189797 A1 * | 8/2008 | Goza | 726/35 |

* cited by examiner

*Primary Examiner* — Timothy Thompson
*Assistant Examiner* — Sherman Ng
(74) *Attorney, Agent, or Firm* — Bushman & Associates, P.C.

(57) ABSTRACT

A wall mounted modular workstation system utilizes individually mountable modules, such as a keyboard/monitor module, a CPU module, and a medical supply module, that may be each be selectively positioned, mounted, rearranged, used or not used, and/or added or removed at a later time. The individually mountable modules are formed with mountings and vertically located openings for electrical lines and module to module ventilation, which reduce/prevent creation of dust during mounting or later modification of the system.

20 Claims, 9 Drawing Sheets

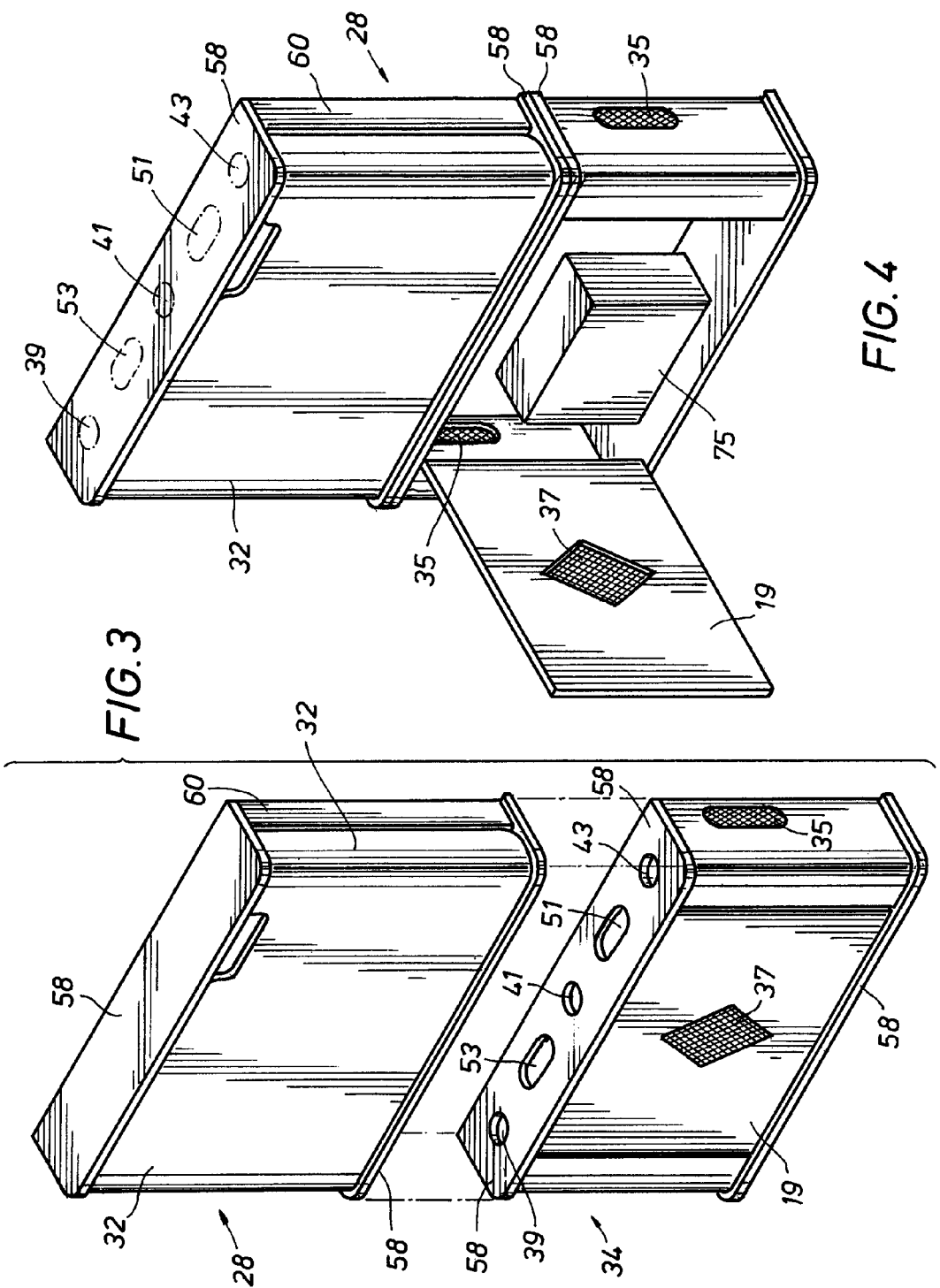

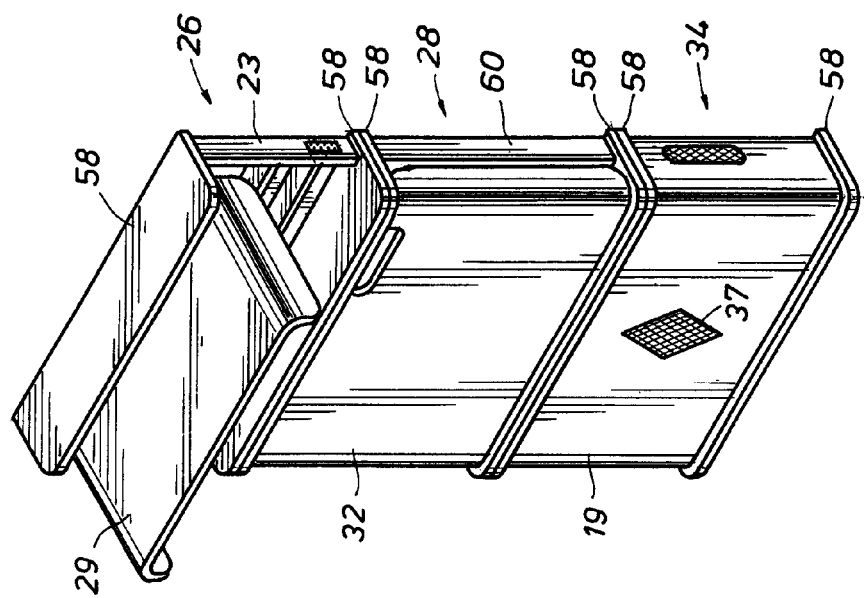
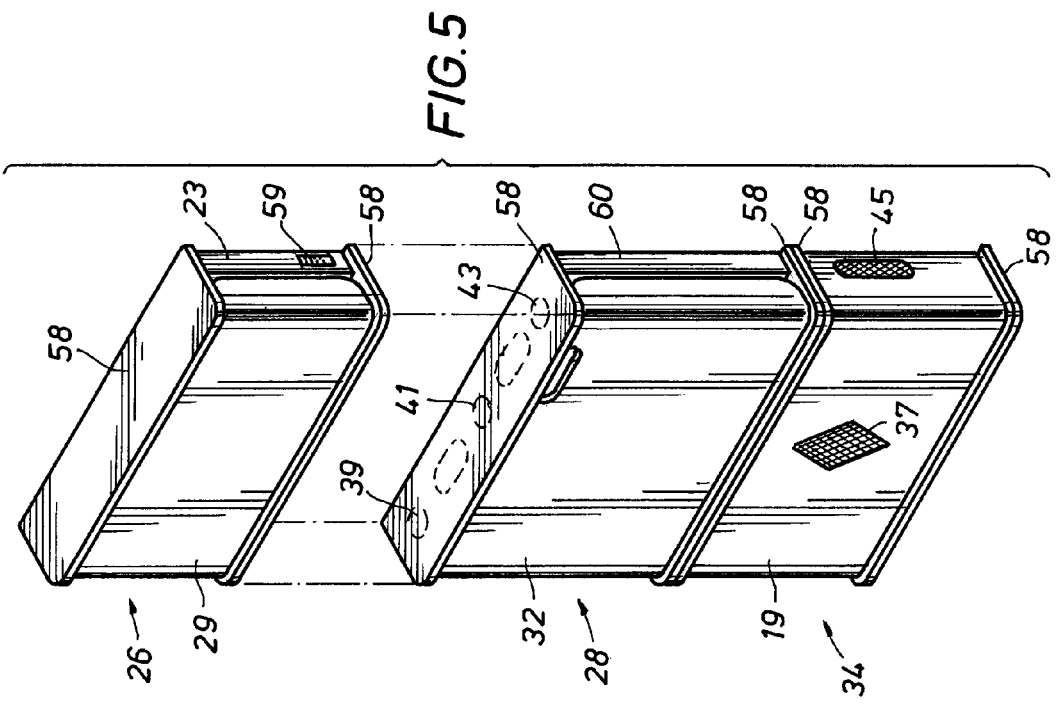

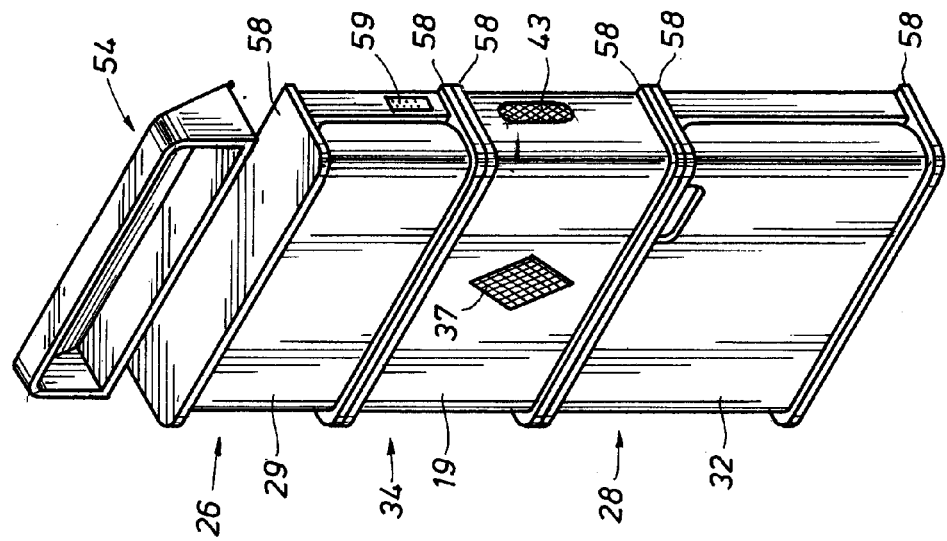
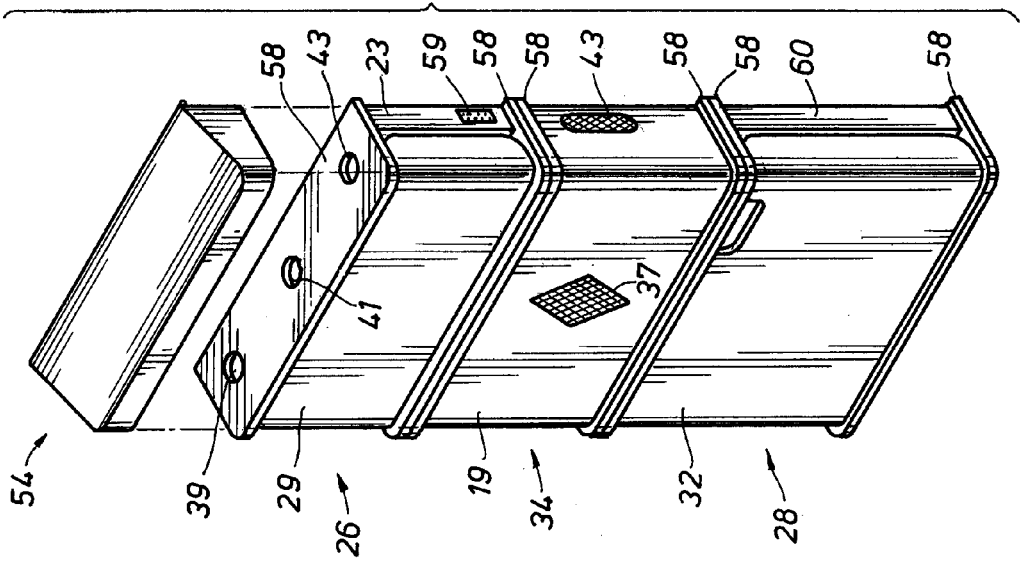

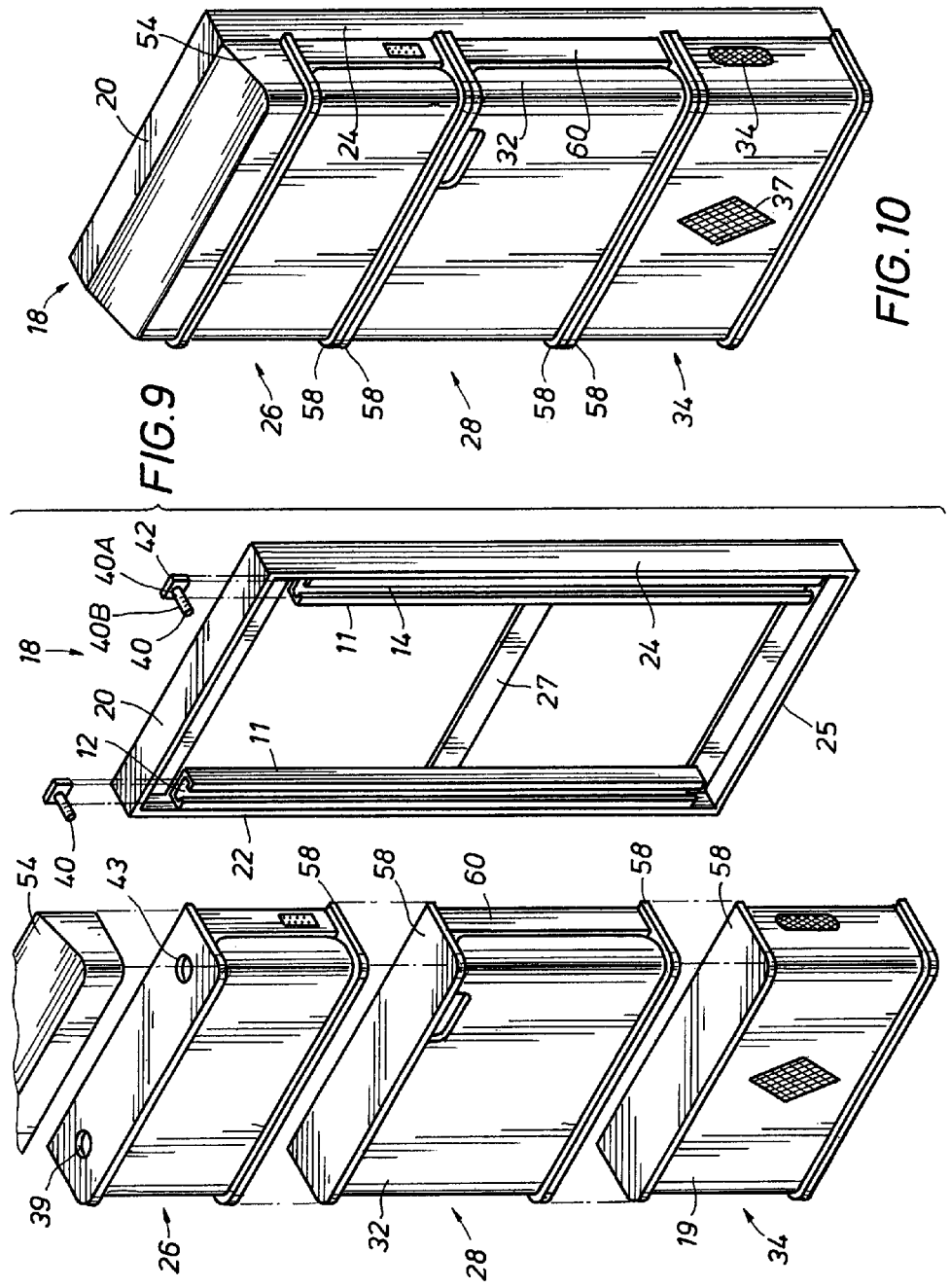

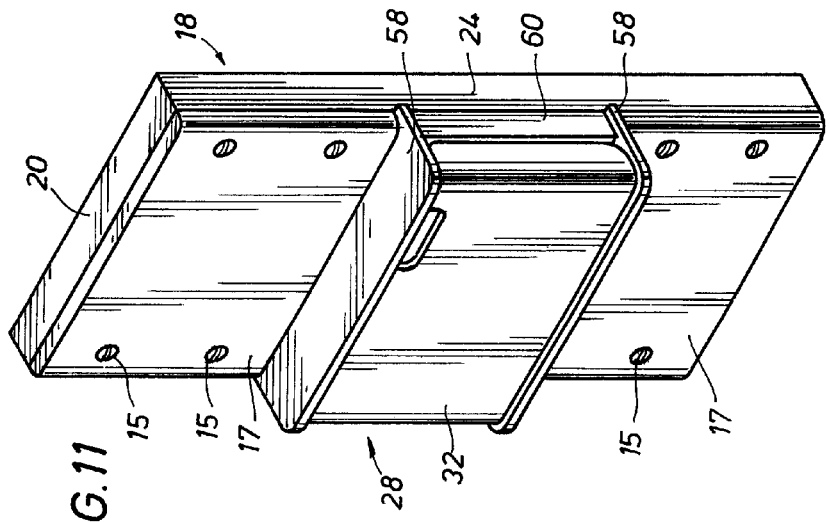
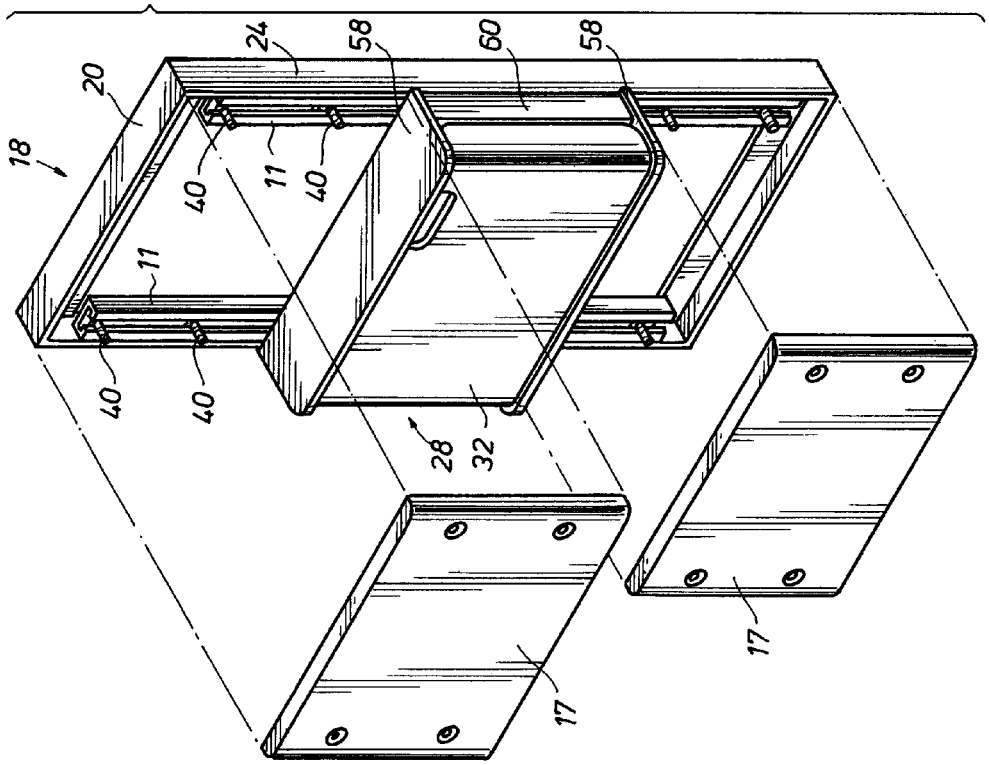

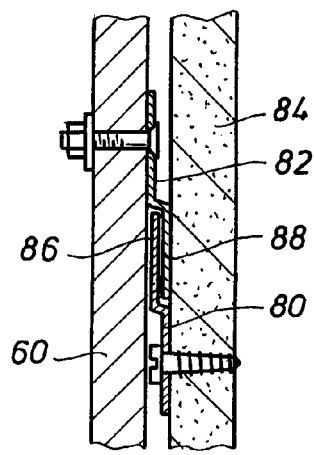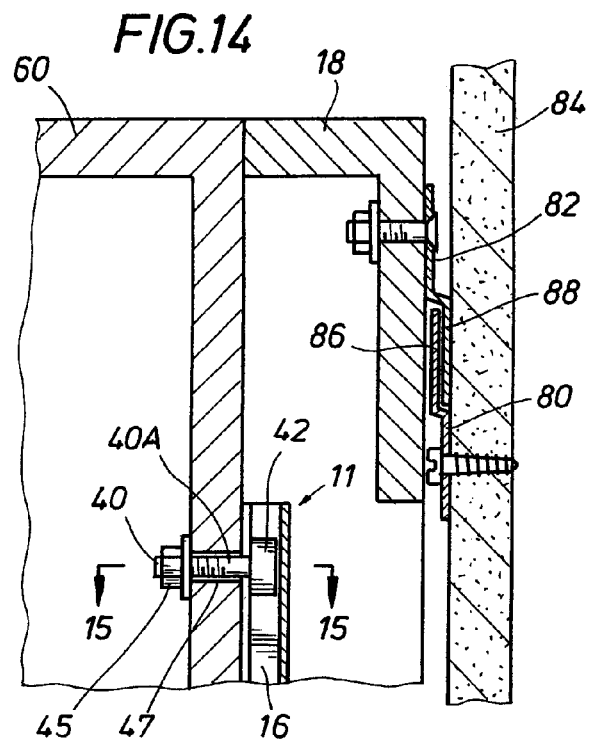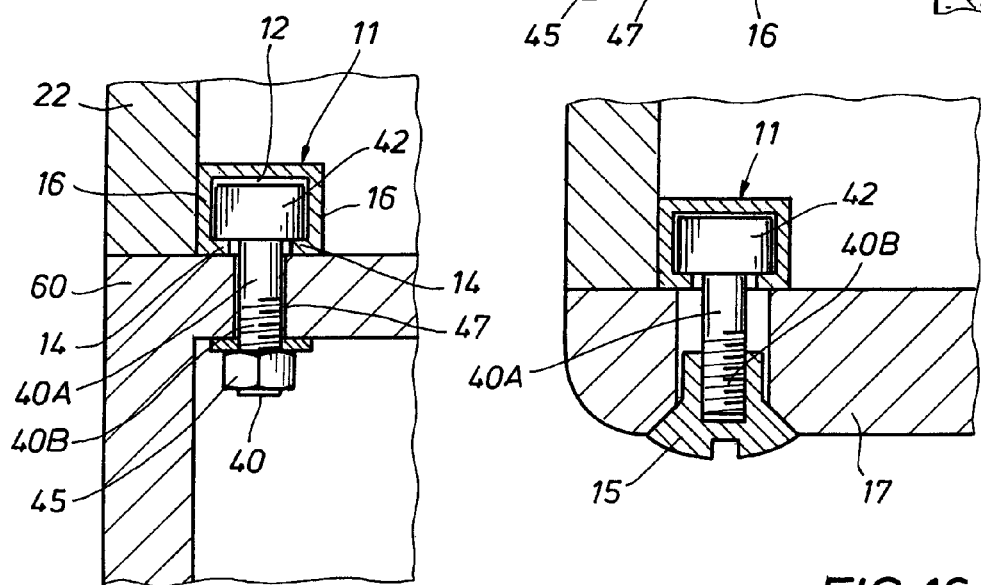

WALL MOUNTED MODULAR WORKSTATION SYSTEM AND METHOD

This application claims benefit of U.S. Provisional Application No. 61/259,366 filed Nov. 9, 2009, which is incorporated herein by reference.

BACKGROUND OF THE INVENTION

1. Field of the Invention

The present invention relates generally to workstations and, more particularly, relates to a wall mounted modular workstation particularly adapted to use in a pathogen clean environment that provides the possibility of adding, rearranging, and customizing modular workstations while reducing and preventing the creation of dust particles.

2. Description of the Prior Art

Wall mounted units for use as computer workstations, including a cabinet for a CPU, a fold-out shelf upon which to position the keyboard, as well as an enclosure for a monitor and peripheral equipment are well known in the art as disclosed, for example, in U.S. Pat. No. D435,361, to the present inventor, which is incorporated herein by reference.

The above patent shows an exemplary design wherein one section may comprise a housing for a computer, another section may provide a housing that may be routinely opened as a keyboard and display, and another section may provide a locked medicine cabinet or other types of medical supplies. The three sections are built into a single housing and are electronically interconnected. This embodiment may comprise various types of locks including centrally controlled locks. However, the combination of all of these sections may not be initially desired by all hospitals. For example some hospitals may wish to have a cabinet for a laptop computer only. Other hospitals may wish to have a combination medicine cabinet and laptop cabinet where the two cabinets are electronically linked for various purposes as discussed above or as discussed by the below referenced patents and patent applications. Other hospitals may initially use laptops but may upgrade to less expensive desktop computers of their own selection, which may use different software, and therefore may desire to add additional cabinets or even rearrange the cabinets to fit a particular room at a later time.

Another consideration is the mounting and/or operation in a pathogen clean environment. Thus, in some cases, it may be important to prevent the possibility of airborne or potentially airborne dust created during installation, which can carry pathogens, and which can be problematic in a hospital environment. Due to the use of fans and the like in computer units, any dust produced during installation may become airborne during or well subsequent to the installation.

The previous patents and applications by the present inventor do not directly address the above problems.

U.S. Pat. No. D600,045 to Roger Goza, issued Sep. 15, 2009, which is incorporated herein by reference, discloses a computer workstation.

U.S. Pat. No. D440,424 to Roger Goza, issued Apr. 17, 2001, which is incorporated herein by reference, discloses a retractable desk.

U.S. Pat. No. D435,362 to Roger Goza, issued Dec. 26, 2000, which is incorporated herein by reference, discloses a retractable desk.

U.S. Pat. No. 7,178,469 to Roger Goza, issued Feb. 20, 2007, which is incorporated herein by reference, discloses a workstation that provides multiple presentation angles for a visible display structure and a related working area structure. The display and working structures are adjustably mounted on a cabinet pedestal that houses electronic equipment connected with components carried by the display and working area structure. The cabinet pedestal is positioned against a wall below gauges and/or other materials mounted on the wall. When not being used, the working area structure closes over the visible display structure to provide a decorative cover over an enclosed area. The display and work structures are retractable to a compact standby position at the top of the cabinet, leaving certain of the wall-mounted materials visible over the top of the stored workstation. A recess provided between the back of the stored display and work structure accommodates certain wall mounted materials.

US Publication No. 20080189797 to Roger Goza, published Aug. 7, 2008, which is incorporated herein by reference, discloses a system and/or method to control access to secured compartments in a facility. Computers positioned throughout the facility are interfaced to respective locking mechanisms to operate the locking mechanism in response to access codes, which may be transmitted over the network. Additional steps may involve programming an authorization computer for providing access codes in whole or part for use with the computers. One or more access points may be functionally coupled to a computer system and/or to the locking mechanism and accessible to users for entry of requests for access to the secured compartment.

US Publication No. 20080189779 to Roger Goza, published Aug. 7, 2008, which is incorporated herein by reference, discloses a system and/or method to control access to medication and/or medical supplies, which may be implemented by providing secured compartments for the medication spread through a medical facility, such as in or adjacent patient rooms and/or connecting locking mechanisms to the secured compartments. Computers positioned throughout the facility are interfaced to respective locking mechanisms to operate the locking mechanism in response to access codes, which may be transmitted over the network. Additional steps may involve programming an authorization computer for providing access codes in whole or part for use with the computers. One or more access points may be functionally coupled to a computer system and/or to the locking mechanism and accessible to users for entry of requests for access to the secured compartment.

US Publication No. 20080188988 to Roger Goza, published Aug. 7, 2008, which is incorporated herein by reference, discloses multi-purpose computers positioned throughout the facility interfaced to respective locking mechanisms to operate the respective locking mechanism in response to access codes, which may be transmitted over the network. Additional steps may involve programming an authorization computer for providing all or part of the access codes in whole or in part for use with the multi-purpose computers. One or more access points may be functionally coupled, or programmed for series operation whereby a first access point is used to access a second access point, for a particular multi-purpose computer.

Consequently, the above patents and applications do not provide solutions for the above discussed problems. Those of skill in the art will appreciate the present invention, which addresses the above discussed problems.

SUMMARY OF THE INVENTION

The present invention, in one aspect, relates to a wall mounted workstation, particularly a wall mounted computer workstation.

In another aspect, the present invention relates to a modular wall mounted system.

In yet another aspect, the present invention relates to a modular, wall mounted workstation, which may mount directly to a wall or may include a base or frame attachable to the wall or other vertical surface and an assembly for releasably, selectively mounting desired components to the base or frame or wall.

Accordingly, the present invention comprises a wall mounted modular workstation system which mounts to a vertical wall and comprises modules that may each be selectively positioned, mounted, rearranged, used or not used, and/or added or removed at a later time, while reducing/preventing creation of dust during mounting or modification.

The invention may comprise an individually mountable keyboard and monitor module adapted to be mounted to the wall and to receive a keyboard and a monitor. The monitor module may comprise a monitor module housing and a fold-down keyboard support pivotally mounted to the monitor module housing to allow access to the keyboard and monitor when folded down and to prevent access when closed. The fold-down keyboard support is pivotal about a horizontal axis.

The monitor module housing comprises an upper side and a lower side that define a plurality of available monitor module openings, which are adapted for electrical cables and ventilation.

If used, an individually mountable CPU module is adapted to be mounted to the wall and to receive a CPU. The individually mountable CPU module may comprise a CPU module housing with an upper side and a lower side that define a plurality of mating CPU module openings. These openings align with the available monitor module openings when the monitor module is mounted to the wall either above or below the individually mountable CPU module.

The mating CPU module openings are adapted for electrical cables and ventilation and are preformed to be operable to prevent creation of dust during mounting.

An individually mountable medical storage module, if used, is adapted to be mounted to the wall and to receive medical supplies. The individually mountable medical storage module may comprise a storage module housing and a door which opens to allow access within the storage module housing. The storage module housing defines a plurality of mating storage module openings, which align with at least one of the plurality of monitor module openings or at least one of the plurality of CPU module openings when the individually mountable medical storage module is mounted to the wall.

In one embodiment, the intermodular openings for electrical cables, power cables, I/O devices, ventilation openings and the like are formed utilizing substantially identical flat top modular elements at the tops and bottoms of the modules, with the aligned openings being formed therein.

In one embodiment, the wall mounted modular workstation system may further comprise a first plurality of interlocking members adapted to be mounted to the wall and a second plurality of interlocking members which mate to the first plurality of interlocking members and are secured to the keyboard and monitor module, the CPU module, and/or the medical storage module. The first plurality of interlocking members are securable to the second plurality of interlocking members to allow individual mounting of the keyboard and monitor module, the CPU module, and the medical storage module.

The second plurality of mating interlocking members and/or the first plurality of mating interlocking members are elongate and are mounted in a horizontal orientation.

In one embodiment, the monitor module housing and the CPU module housing each comprise vertical sides which define a plurality of vents therein. The upper side and the lower side of the CPU module housing and the upper side and the lower side of the monitor module housing comprise a flat horizontal surface with a length that extends outside of the vertical sides.

The wall mounted modular workstation system may further comprise a pivotal mounting for pivotal movement of the keyboard and monitor module on a vertical axis.

The wall mounted modular workstation system may further comprise a frame sized to selectively carry any one or all of the individually mountable keyboard and monitor module, the individually mountable CPU module, and the individually mountable medical storage module.

The wall mounted modular workstation system may further comprise a plurality of rails secured to the frame. A plurality of fasteners for the rails may be utilized which permit positioning and fastening of the individually mountable keyboard and monitor module, the individually mountable CPU module, and the individually mountable medical storage module in a plurality of positions.

In another possible embodiment, a method for making a wall mounted modular workstation system, may comprise steps such as adapting a keyboard and monitor module to receive a keyboard and a monitor and to be individually mounted to the wall, and providing that the individually mountable keyboard and monitor module comprises a monitor module housing and a fold-down keyboard support pivotally mounted to the monitor module housing, which allows access to the keyboard and monitor when folded down and prevents access when closed.

Other steps may comprise making the monitor module housing with an upper side and a lower side that define a plurality of monitor module openings, which are adapted for electrical cables and ventilation and which are preformed to prevent formation of dust during installation to the wall.

The method may comprise adapting a CPU module to receive a CPU and to be individually mountable to the wall, providing that the individually mountable CPU module comprises a CPU module housing, and making the CPU module housing with an upper side and a lower side that define a plurality of mating CPU module openings. The CPU module openings align with the available monitor module openings in the monitor module housing when the individually mountable keyboard and monitor module and the individually mountable CPU module are mounted to the wall with the individually mountable keyboard and monitor module either above or below the individually mountable CPU module.

Other steps may comprise providing a storage module adapted to be mounted to the wall for receiving supplies, providing that the individually mountable medical storage module comprises a storage module housing and a door which opens to allow access within the storage module housing, and making the storage module housing with a plurality of mating storage module openings which align with at least one of the plurality of monitor module openings or at least one of the plurality of CPU module openings when the individually mountable medical storage module is mounted to the wall.

The method may further comprise providing a first plurality of interlocking members adapted to be mounted to the wall and securing a second plurality of mating interlocking members to one or more of the keyboard and monitor module, the CPU module, and the medical storage module, whereby the first plurality of interlocking members are securable to the second plurality of interlocking members to allow individual mounting of the keyboard and monitor module, the CPU module, and the medical storage module.

The method may further comprise providing that the second plurality of mating interlocking members are elongate and are mounted in a horizontal orientation.

The method may further comprise making the monitor module housing and the CPU module housing with vertical sides that define a plurality of vents.

The method may further comprise providing that the upper side and the lower side of the CPU module housing and the upper side and the lower side of the monitor module housing each comprise a flat horizontal surface with a length that extends away from vertical sides.

The method may further comprise pivotally mounting said keyboard and monitor module for pivotal movement about a vertical axis.

The method may further comprise providing a frame sized to selectively carry any one or all of the individually mountable keyboard and monitor module, the individually mountable CPU module, and the individually mountable medical storage module.

The method may further comprise securing a plurality of rails to the frame and providing a plurality of fasteners for the rails which permit positioning, rearranging, and/or fastening of the individually mountable keyboard and monitor module, the individually mountable CPU module, and/or the individually mountable medical storage module in a plurality of positions.

BRIEF DESCRIPTION OF THE DRAWINGS

FIG. 3 is a perspective exploded view of possible modular components which can be wall mounted in different arrangements and/or may be used individually or in selected groups of modules in accord with possible embodiment(s) of the invention.

FIG. 4 is a perspective view showing the modules of FIG. 3, wherein the wall-mounted modular components comprise a CPU panel at the bottom with an open access door and wherein the selected modules are secured on top of each other and further connected for electrical and ventilation purposes in accord with possible embodiment(s) of the invention.

FIG. 5 is a partially exploded perspective view of another series of modular components, in this case comprising a medical storage module for mounting at the top, which can be wall mounted in different arrangements and/or may be used individually or in selected groups of modules in accord with possible embodiment(s) of the invention.

FIG. 6 is a perspective view of the modules shown in FIG. 5 mounted to the wall in accord with possible embodiment(s) of the present invention.

FIG. 7 is a partially exploded perspective view of another possible group of modules mounted to a wall with a sloped top module mounted on top in accord with possible embodiment(s) of the present invention.

FIG. 8 is a perspective view of group of modules of FIG. 7 mounted to the wall in accord with possible embodiment(s) of the present invention.

FIG. 9 is a partially exploded perspective view of a plurality of modules mounted to the wall utilizing a frame in accord with possible embodiment(s) of the present invention.

FIG. 10 is a perspective view of the embodiment of FIG. 9 secured to the wall via a frame in accord with another embodiment of the present invention.

FIG. 11 is a partially exploded perspective view of another embodiment of the present invention.

FIG. 12 is a perspective view of the embodiment of FIG. 11 secured together a wall utilizing a mounting rack in accord with possible embodiment(s) of the present invention.

FIG. 13 is an enlarged elevational view, partially in section, showing mating interlocking members to secure panels directly to the wall without a frame in accord with possible embodiment(s) of the present invention.

FIG. 14 is an enlarged elevational view, partially in section, showing the mating interlocking members of FIG. 13 utilized to secure a frame to the wall in accord with possible embodiment(s) of the invention.

FIG. 15 is an enlarged elevational view, partially in section, showing a connection to a module to a frame in accord with possible embodiment(s) of the invention.

FIG. 16 is an enlarged elevational view, partially in section, showing a connection of a blanking plate to a frame in accord with possible embodiment(s) of the invention.

DESCRIPTION OF THE PREFERRED EMBODIMENTS

While the present invention would be described with a component or modular system for mounting on a wall, it would be understood that the system of the present invention can be mounted on any vertical surface or support. Components of the present invention may be mounted directly to the wall utilizing standard bolts and/or preferably utilizing dust prevention mounting elements such as interlocking members as discussed hereinafter, or may be mounted utilizing various frame members with or without interlocking members. The modules of the present invention may be mounted individually or in groups or added on in various arrangements at various times and still cooperate with each other with respect to physical mating, electrical lines, data lines, and computer ventilation.

Figure 1:
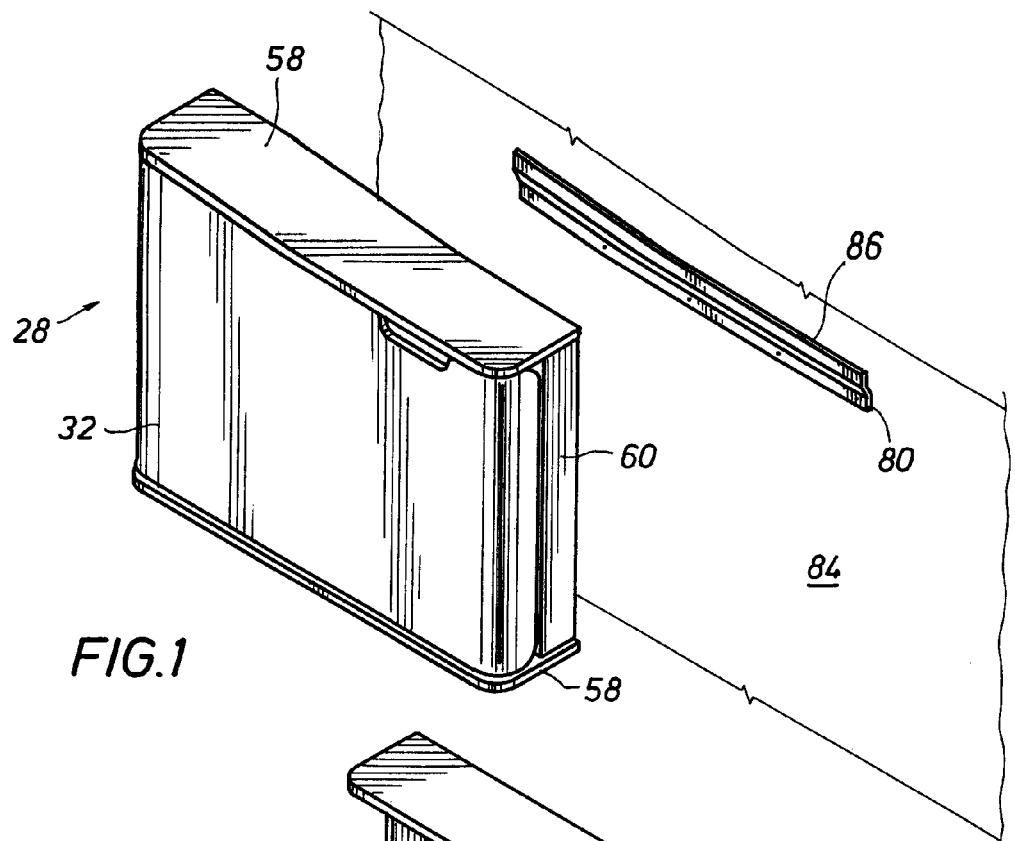
FIG. 1 is a perspective view showing a monitor/keyboard module mounted to a wall in accord with possible embodiment(s) of the invention.
Figure 2:
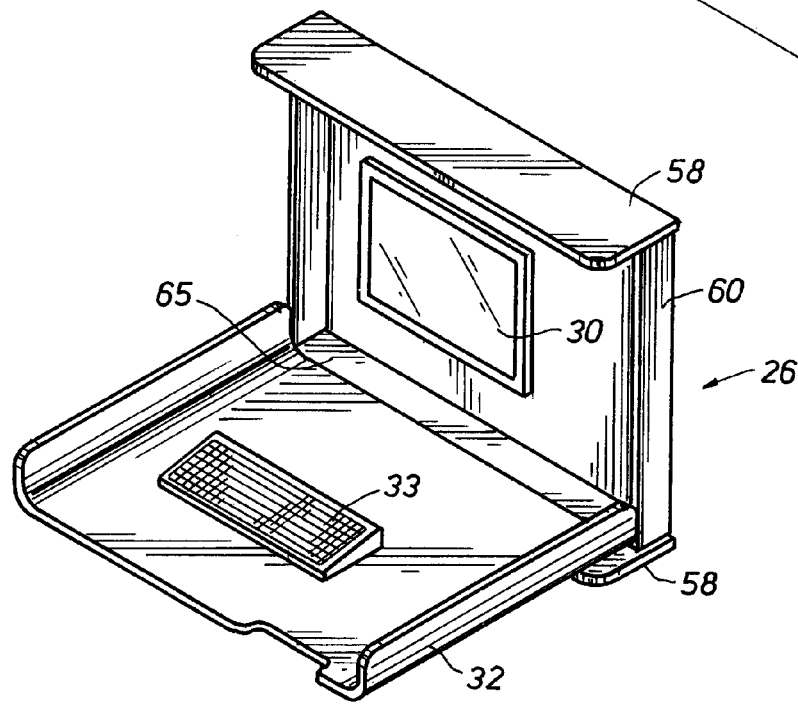
FIG. 2 is a perspective view of one embodiment of the monitor/keyboard module with fold-down keyboard support shelf in the open position in accord with possible embodiment(s) of the invention.

Referring now to the drawings and, more particularly, to FIG. 1 and FIG. 2, there is shown a possible embodiment of the invention wherein one or more workstation modules are mounted to wall 84 utilizing horizontally positioned interlocking members such as interlocking members 80. Greater detail of the interlocking members is shown in FIG. 13, which is discussed hereinafter. In the specific example of FIG. 1, the only mounted module is a monitor/keyboard module 28, which may be utilized for holding a monitor 30 and keyboard 33 (shown in FIG. 2), and having a fold-down keyboard support shelf 32 upon which keyboard 33 can be mounted. Monitory/keyboard module 28 may also be utilized for housing a laptop.

In this embodiment, housing 60 supports fold out shelf 32, whereby shelf 32 swivels outwardly for use of the keyboard along a horizontal axis. Housing 60 may further carry support shelf 65 on which monitor 30 or a mounting for a laptop may be provided.

As discussed hereinafter, a frame 18 (FIGS. 9, 10, 11 and 12) may or may not be utilized to mount the modular system of the present invention to a wall, such as vertical wall 84. Frame 18 may or may not be mounted to the wall using interlocking member 80. Interlocking member 80 may be utilized in a manner that allows for relatively dust free mounting and/or changes to the system. In this embodiment, interlocking members 80 may be mounted to wall 84, as discussed hereinafter.

The simple structure of interlocking members 80 allows dust to be easily cleaned during the mounting process. For instance, the dust from any hole drilled may be vacuumed prior to inserting anchors and the like for supporting the interlocking members.

If desired, multiple sets of interlocking members 80 can be mounted to the walls to allow expansion of the modular system. Unused interlocking members 80 may be covered with suitably designed panels and the like if desired. In this case, any further modular system changes including adding new modules, rearranging the modules, or the like can be accomplished without creating any further dust, as explained hereinafter.

In another embodiment of a modular workstation system, FIG. 3 and FIG. 4 show a CPU module 34 that may be utilized to house a desktop computer or CPU 75, which may cooperate with the monitor/keyboard and/or with the laptop. Door 19 may be provided in CPU module 34 to gain access to CPU 75 and wiring contained with the CPU module 34. The required electronics and electrical connections between monitor/keyboard module 28 and CPU module 34, as well as control software for various embodiments of hardware are discussed in my previous patents and applications referred to hereinbefore, which are incorporated by reference herein. However, presently preferred means to provide such connections in separately mounted, rearrangeable, removable and/or replaceable modular units is not shown.

In accord with the present invention, the modules of FIGS. 3 and 4, and/or including module 26 (shown in FIG. 5 and FIG. 6) may comprise built-in or pre-formed aligned conduits for selectively connecting power, data lines, I/O cables, and/or ventilation ducts, without the need for making holes or other openings during installation that could create unwanted dust in a hospital environment. In one possible embodiment, CPU module 34 and other modules may comprise side vents 35 and/or front vents 37.

In one possible embodiment of the invention, identically shaped flat top elements 58 may be utilized on the tops and bottoms of the modules, which comprise pre-formed mating conduits for wiring and/or ventilation. For example, module to module electrical and data connections may be made through openings such as aligned openings 39, 41, and 43 in flat top element 58 at the top of CPU module 34, which are aligned with corresponding aligned openings of flat top element 58 positioned at the bottom of monitor/keyboard module.

Although not necessarily shown or required, identically shaped or similarly shaped flat top elements 58, which may be used at the tops and bottoms of any module, comprise mating openings 39, 41, and 43. Air vents 51 and 53 may be provided and utilized to conduct air to correspondingly aligned air vents in other flat top elements 58, which may be secured to tops and bottoms of monitor/keyboard module 28.

In FIG. 4, the openings in flat top element 58 are shown dashed to indicate that the aligned openings/vents may be covered with plastic caps, coverings, and the like when not in use but are available for use when desired. The openings are preferably provided at the tops and bottoms of monitor/keyboard module 28 and CPU module 34 to allow mounting either module on top or bottom and/or for rearranging without the need for making new openings. Thus, without drilling or creating dust, additional modules may be added to the system or the different modules of the system may be repositioned with respect to each other.

When using a rack mounted system, as indicated by frame or base 18, shown for example in FIGS. 9, 10, 11, and 12, electrical, electronic, and at least some air vents may be made to communicate through an offset space that may be provided between the backs of the modules and the wall if the rack provides an offset between the backs of the modules and the wall. Accordingly, other configurations for air vents, electrical lines, and data lines may be utilized, if desired, when utilizing frame assembly 18. However, the possibility of module to module preformed openings could also be utilized with a rack mounted system.

FIGS. 5 and 6 show another embodiment of the modular system which may include medical storage module 26 mounted at the top of a stack of workstation modules. However, storage module 26 may or may not be utilized in the modular system depending on the needs, preferences, and selection of the client.

An electronically locked medical storage module 26 is discussed in my previous patents and/or applications referred to and incorporated herein by reference. As only one possibility, storage module 26 may be controlled by keypad 59 and/or computer keyboard 33 and/or remotely located computers. Such constructions may typically require electrical connections. For wall mounted randomly positioned modules of the present invention, the electrical connections can be problematic. Accordingly, it may be desirable to have power and control wiring connect through openings 39, 41, 43 and like in mating flat top module elements 58, as discussed hereinbefore.

As noted above, medical storage module 26 comprises door 29, which is preferably lockable. Door 29 opens with respect to housing 23 as shown in FIG. 6 to allow access to medical supplies, medicine the like. Additional locked doors and containers may be provided inside storage module 26. Door 29 may fold downwardly or pivot on a horizontal axis or may open to the side by pivoting on a vertical axis.

Moreover, whether added initially or later, or after rearrangement of the modules, storage module 26 of the modular system of the present invention may be utilized to electrically and physically mate to monitor/keyboard module 28 and/or to CPU module 34.

It will be appreciated that any of the modules of modular system can be combined and mounted, in different orders, on the mounting frame 18 described above and/or may be secured to the wall without frame 18 to achieve a desired look and the required amount of flexibility for the user.

Referring now to FIGS. 7 and 8, there are shown additional modules, and configurations of modules which can be selected for wall mounting. Thus, in one embodiment, there is shown a sloped top module 54, medical storage module 26, a CPU compartment module 34, and a monitor/keyboard module 28.

It will be noted that the relative positions of CPU module 34 and monitor/keyboard module 28 are inverted in this example as compared to that of FIG. 3-6. Thus, the various modules may be rearranged as desired. In this example, flat top or shelf module elements 58 are utilized on the tops and bottoms of each module. As well, in this example, the number of openings in flat top module elements 58 can be reduced for some modules but is still aligned with openings that would be found in other flat top module elements. FIG. 8, illustrates a pivotal opening of sloped top module 54, if desired.

Referring to FIGS. 9, 10, 11, and 12, there is shown frame assembly 18 comprising frame components that may be utilized to mount one or more parts and components for use in various embodiments of the present invention, including steps to mount desired modules or components on a wall.

In reviewing the teachings of this application, it will become apparent hereinafter that after frame or base 18 (or interlocking mounting members 80) is mounted and any dust cleaned, that any further changes, additions, replacements, and reorganizations in the module system can be made without creating dust. This allows continued use of the system for patients without the need for concern about creating dust, which can be problematic in hospital environments.

FIG. 9 shows mounting rails 11, which may be utilized in one possible embodiment of the invention. In this example, rails 11 are mounted internally of frame sides 22 and 24 of frame 18 but could also be mounted on other surfaces of sides 22 and 24. FIG. 15 provides an enlarged view of one possible embodiment of rail 11 and the mounting fasteners 40. In one possible configuration, mounting rails 11 may comprise internal channels 12 having flange portions 16, each of the flange portions 16 having a lip 14, which face inwardly towards one another.

However, other rail members, which may interlock to corresponding module mounting surfaces and/or rails with specialized or standard fasteners may also be utilized. While in one embodiment, rails 11 are mounted to frame 18, in another embodiment, rails 11 may be attached directly to the wall without the use of frame or base 18. Other mounting methods for a modular system may comprise rails, interlocking members, or the like mounted either vertically or horizontally to the wall without use of base or frame 18.

Base 18, which is best shown in FIGS. 9 and 11 as generally rectangular, has top 20, opposed sides 22 and 24, and a bottom 25, there preferably being one or more horizontal or diagonal cross-members such as cross-member 27. It would be appreciated that base or frame 18 can be mounted to a wall by any number of methods known to those skilled in the art. However, FIG. 14 shows one possible means for mounting frame 18 to wall 84 using interlocking members 80 and 82, which may result in reduced dust creation, as discussed in more detail hereinafter.

Mounting of base or frame 18 may preferably be performed in the hospital at a time when the room is unoccupied or when the room can be carefully cleaned of dust after mounting. After frame 18, and/or interlocking members 80 and 82 discussed hereinafter, are mounted to the wall and the electrical connections from the wall are provided, no further dust is produced in mounting. Moreover, cleaning of the room mounting is relatively straight forward due to the absence of any significant number or size components present, and the relative lack of clutter.

Rails 11 are shown as being secured to base 18 internally to sides 22 and 24, which can be accomplished by screws, bolts, other fasteners, and/or methods known to those skilled in the art. In this embodiment, rails 11 are mounted vertically, which will allow relative vertical movement for positioning of the modular components prior to their being clamped in position to rails 11.

Referring next to FIG. 10, modules 54, 26, 28, and 34 are shown secured to frame 18 However, one or more of these modules may or may not be present depending on the requirements of the hospital or other user. Moreover, the modules may be repositioned as discussed hereinbefore.

For example, in FIG. 11 only monitor/keyboard module 28 is shown mounted to frame 18. Thus, it will be appreciated that storage compartment 26 and/or CPU module 34 could also be mounted on rails 11 or that, as shown, storage compartment 26 and/or CPU module 34 may be dispensed with if desired. Moreover, storage compartment 26 may be mounted along with CPU compartment 34 or in place thereof.

While the aligned electrical, electronics and ventilation openings preferably uniformly provided in flat top module elements 58 along the tops/bottom of keyboard/monitor compartment 28 and CPU compartment 34 are shown in previous figures, they may or may not be utilized in this embodiment, or may be only partially utilized when frame 18 is utilized if there is sufficient offset space between the wall and the backs of the modules. However, they may be conveniently utilized in one possible embodiment of the present invention.

Blanking plates 17 may be utilized to cover the frame regions that are not being utilized. Blanking plates may be smaller in width if desired to reorganize the positioning of monitor/keyboard module 32. For example, if half width blanking plates were utilized then monitor/keyboard module 32 could be moved upwardly or downwardly in the mounting shown in FIG. 11 and FIG. 12. As well, other blanking plates or coverings could be utilized.

Blanking plates 17 may be secured to frame 18 utilizing bolts 15, shown in detail in FIG. 16. The other details of the enlarged blanking plate rail mounting shown in FIG. 16 are discussed hereinafter.

Figure 18:
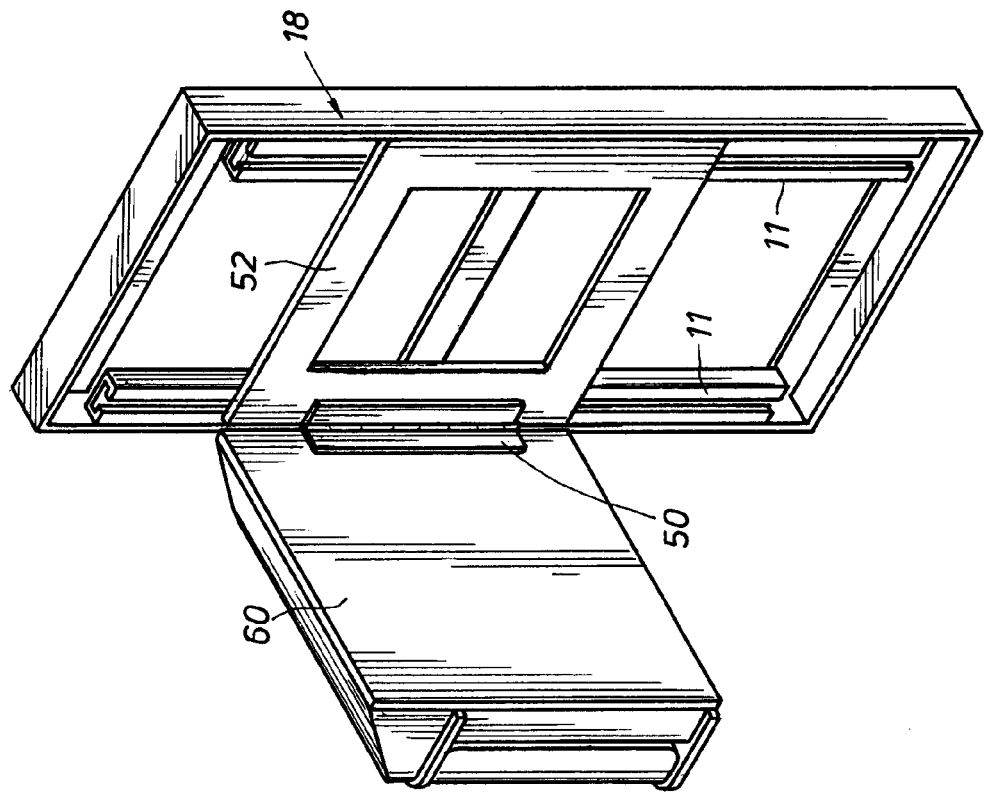
FIG. 18 is a perspective view showing the modules of FIG. 17, wherein the modules are adapted to swivel away from the mounting assembly, but wherein a door may also open downwardly as illustrated in FIG. 2 to provide access to a monitor and keyboard, in accord with possible embodiment(s) of the invention.
Figure 17:
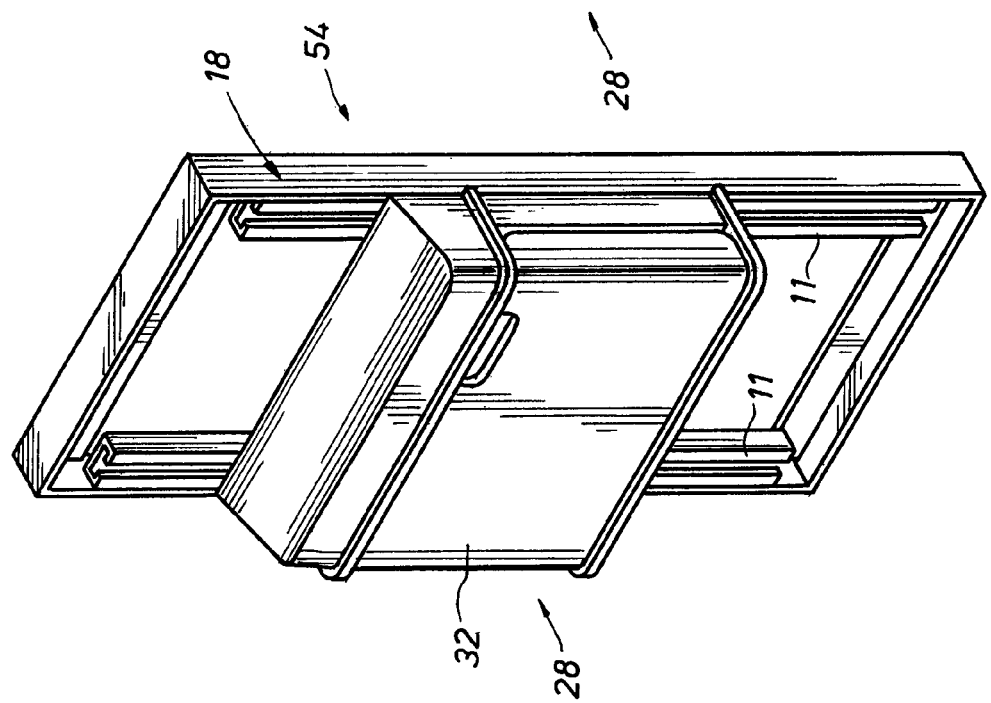
FIG. 17 is a perspective view of one embodiment of the present invention showing two modules mounted on a frame assembly in accord with possible embodiment(s) of the invention.

In another possible embodiment, FIGS. 17 and 18 show the frame or base having rails 11 attached thereto and a typical module such as monitor/keyboard module 28 attached thereto in the manner described above. However, monitor/keyboard module 28 may also be secured to the wall without frame or base 18 by one of the methods discussed above and/or as discussed below.

Monitor/keyboard module 28 may comprise a backing member or frame 52 to which is secured hinge 50 on one side thereof. Hinge 50 is vertically oriented. If base or frame 18 is not used, then frame 52 be mounted directly to the wall utilizing bolts, interlocking members, and/or rails, as discussed herein. Hinge 50 may also comprise pivot points and the like oriented to allow module 28 to pivot on a vertical axis with respect to the floor.

Hinge 52 allows the enclosure or housing portion of monitor/keyboard module 28 to swivel with respect to a vertical axis. As noted previously, and perhaps better shown in FIG. 2, keyboard fold-down support shelf 32 pivotally opens along a horizontal axis with respect to the floor. Thus, pivot points or horizontal hinges, or the like may be utilized to allow support shelf 32 to open for access to the keyboard and monitor. Accordingly, monitor/keyboard module 28 comprises fold-down keyboard support shelf 32, which can pivot to an open position along a horizontal axis but as shown in FIG. 18 can also simultaneously be pivoted along a vertical axis with the remainder of the housing 60 of monitor/keyboard module 28.

The vertical hinge feature allows the user of the wall mounted system in a patient's room to view the monitor in an orientation that may be more comfortable for the patient and/or the patient's family. As well, it may be desirable to talk to and view the patient while talking with the patient and/or without the family overlooking the monitor or looking at the back of the user. Swivel 50 may also be useful for working with wiring and the like behind the module(s).

Referring again to FIG. 17 another possible module 54 having a sloped top may be included in the modular system 10. In this embodiment, module 54 is shown as mounted on frame 18 and rails 11. Module 54 may also be mounted to the wall without the use of frame 18. Module 54 may also be mounted by means of a vertically oriented hinge, such as hinge 50, which was shown to allow module 28 to swivel on a vertical axis. As noted above, the vertical swiveling feature has many benefits including providing access behind module 28 and/for working on wiring, ventilation, and positioning module 28 and/or module 54 and/or other modules in a wide range of from 0° to 90° or greater from the wall wherein it is assumed that at 0° the module is oriented flat against the wall or frame. Depending on the width or depth of module 28, module 28 may swivel on a vertical axis typically from 0° up to a range of 100° to nearly 180°. Module 28 is shown in the 0° position of movement along a vertical axis in FIG. 2.

The method of mounting the various modules of modular system on rails 11 is illustrated with reference to FIG. 9-12, and FIG. 15. As noted above, rails 11 may be mounted to frame 18, preferably perpendicular to the floor so as to be vertically oriented, by a number of conventional methods well known to those skilled in the art. Rails 11 may also be mounted to the wall without frame 18. If desired, rails 11 might also be horizontally oriented.

If frame 18 is used, it will also be understood that frame 18 can be secured to a wall or other such vertical surface in any number of well known ways. As discussed hereinafter, a relatively dust free method of one embodiment utilizes interlocking mounting members 80 and 82 to mount frame 18 to wall 84 as shown in FIG. 14.

The method of mounting utilizing frame 18 is now discussed referring to FIGS. 9 and 11, and for greater detail to FIG. 15. A series of bolts 40 having a general rectangular head 42 may be employed for positioning and fastening of the modules to the frame. Accordingly, when the heads 42 of bolts 40 are slid into an open end of the rails 11, as suggested in FIGS. 9 and 11, they can be moved freely up and down but cannot move laterally with respect to the rails 11. In this regard, and as can be seen in more detail in FIG. 15, the flanges 16 and lips 14 on rails 11 cooperate to form channel 12 which as can be seen as a squared off generally dovetail configuration.

As seen in FIG. 11, several bolts 40 have been placed in channel 12. Once bolts 40 are positioned in rails 11, the shank 40A of bolt 40 can be received through apertures or holes 47 in the back of the module, as shown in enlarged detail in FIG. 15. In the example of FIG. 15, housing 60 of module 28 is shown however any modules could be mounted to frame 18. Nuts 45 are received on a threaded portion 40B of shank 40A of bolts 40 to thereby secure module 28 (or other modules) to bolts 40. However, it will be appreciated that until nuts 45 received on the threaded portion 40B of bolts 40 and are securely tightened, module 28 or other modules will be free to move vertically along rails 11 but cannot move laterally (horizontally).

FIGS. 10 and 12 shows various module arrangements as having been connected and positioned at a desired location on rails 11. Accordingly, it will be seen that hospitals or other users may select the modules and arrangement of modules that will benefit them the most. Other modules may not be selected or may be added at another time.

Figure 19:
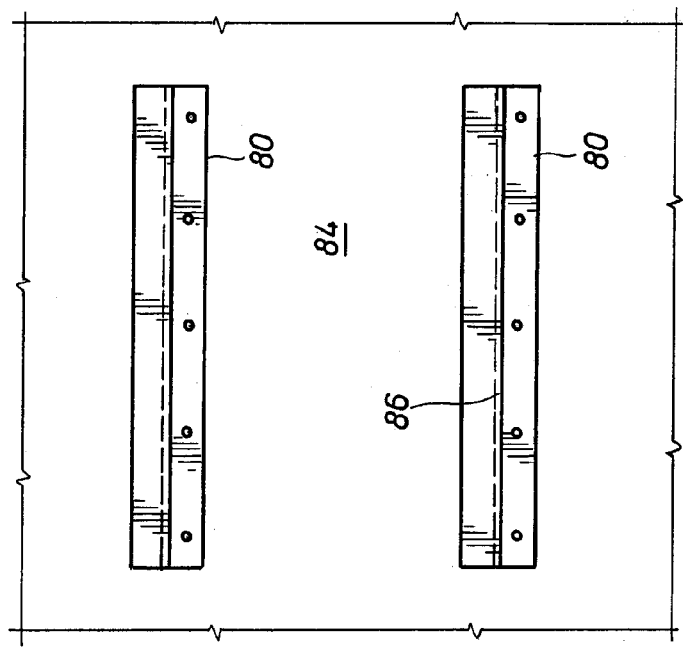
FIG. 19 is an elevational view of horizontally mounted interlocking members secured to a vertical wall for mounting modular components to the wall in accord with possible embodiment(s) of the present invention.
Figure 20:
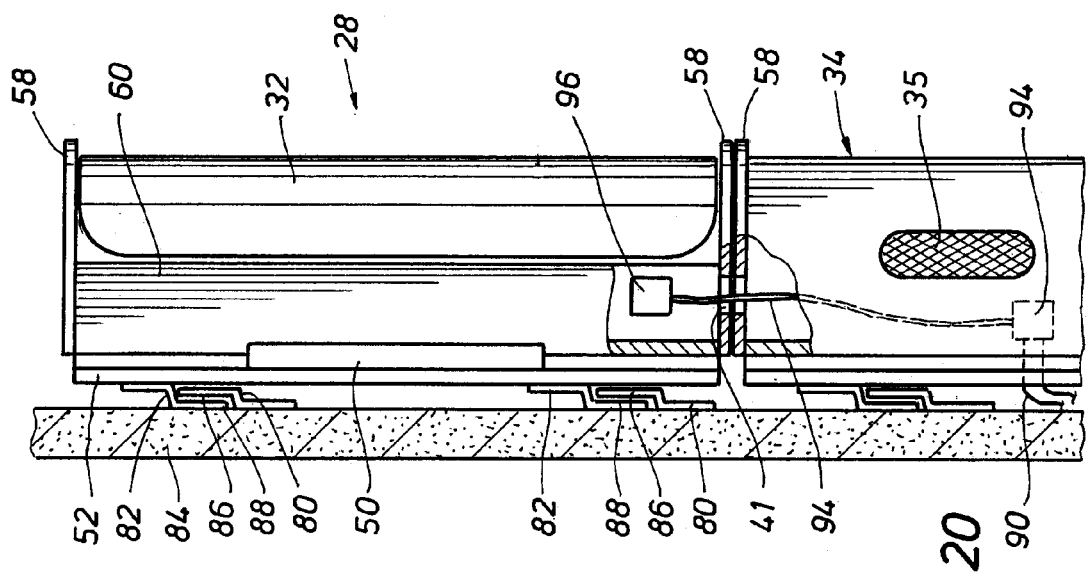
FIG. 20 is a side elevational view, in section, of modular components mounted to a vertical wall utilizing pairs of horizontally oriented interlocking members in accord with possible embodiment(s) of the present invention.

Now referring to the interlocking members 80 and 82 shown in detail in FIG. 13, and more generally in FIG. 1 and FIGS. 19 and 20. In FIGS. 13 and 20, interlocking members 80 are shown from the side, each interlocking member 80 comprises an upwardly extending lip 86. In one embodiment, mating interlocking members 82 are mounted directly to the modules. For example, in the enlarged view of FIG. 13, interlocking member 82 is shown secured to housing 60 of keyboard/monitor module 26. In another embodiment, mating interlocking members 82 are utilized to mount frame 18 to the wall as shown in FIG. 14.

The correct position for interlocking members 82 on the modules and/or frame 18 may be measured, and mounted to panels outside the hospital. In this way, the module mountings can also be thoroughly cleaned before being brought to the hospital. As well any changes to the positioning of interlocking members 82 on the modules may be made outside the hospital. Thus, any changes, additions, removals, rearrangements to the modular system may be made by adjusting the position of interlocking members 82 without any further drilling inside the hospital, thereby limiting creation of dust.

For mounting, each mating interlocking member 82 comprises a downwardly extending hook 88 that is inserted into upwardly extending lip 86 of each interlocking member 80. Accordingly, the modules or frame 18 are held in place by their weight and the friction on the connection. Additional stops may be utilized to prevent undesired side movements and/or upward movements. Other interlocking members may also be utilized.

In the embodiments of FIGS. 19 and 20, the modular system is mounted to the wall preferably utilizing a plurality of mating interlocking members 80 and 82. A plurality of interlocking members 80 may be mounted to the hospital wall as indicated in FIG. 19. Assuming sufficient interlocking members 80 are mounted to the wall, then after this mounting, any other mountings, additions, changes will not produce dust due to drilling, grinding, or the like.

The modular system shown in FIG. 20 includes monitor/keyboard module 28, which may be mounted above CPU module 34. Side vents 35 may be utilized to vent the computer and/or electronic components. Aligned openings such as opening 41 and/or other aligned openings discussed hereinbefore may be utilized for electrical cables, I/O cables, ventilation, and the like as discussed hereinbefore.

Thus, wall power line 90 may enter CPU module 34, to power supply 92, and be directed as power line 94 to another power supply 96 in keyboard/monitor module 28 through opening 41 and/or other aligned openings between the separately mounted modules. If medical storage module 26 is provided, then the power can be run to that module as well. If locks, I/O devices, and the like are utilized, then the openings allow interconnection between the modules. If the openings, vents and the like are not used due to the modular configuration, they may be covered with caps and the like but preferably remain readily available for use.

As discussed hereinbefore, medical supply module 26, CPU module 34, and monitor/keyboard module 28 comprise doors which may be opened either by horizontally folding down or vertically pivoting open. The modules comprise ports or openings, preferably utilizing standard flat top elements 58, which are aligned with each other to allow cabling, venting, and the like. Typically each module comprises electrical and/or electronic equipment, which in one preferred embodiment, are designed for use within a hospital or the like. Use of the present invention allows a highly configurable system which can be expanded or limited in size depending on the needs of the hospital. For example, a single module may be mounted in hospital rooms and then expanded as needed.

It can be seen from the above that the present invention provides a system for setting up a workstation which has great versatility and aesthetic appeal. Once a mounting assembly is in place on the wall or other vertical surface, any combination of modules can be employed in numerous different configurations to achieve the desired degree of utility and, if desired, the desired degree of aesthetic appeal.

The invention claimed is:

1. A wall mounted modular workstation system which mounts to a wall, comprising:
   an individually mountable keyboard and monitor module adapted to be mounted to said wall and to receive a keyboard and a monitor, said individually mountable keyboard and monitor module comprising a monitor module housing and a fold-down keyboard support pivotally mounted to said monitor module housing to allow access to said keyboard and monitor when folded down and to prevent access when closed, said fold-down keyboard support being pivotal about a horizontal axis, said monitor module housing comprising an upper side and a lower side that define a plurality of available monitor module openings, which are adapted for electrical cables and ventilation;
   an individually mountable CPU module adapted to be mounted to said wall and to receive a CPU, said individually mountable CPU module comprising a CPU module housing, said CPU module housing comprising an upper side and a lower side which define a plurality of mating CPU module openings which align with said available monitor module openings in said monitor module housing when said individually mountable keyboard and monitor module and said individually mountable CPU module are mounted to said wall with said individually mountable keyboard and monitor module either above or below said individually mountable CPU module, said mating CPU module openings being adapted for electrical cables and ventilation and being preformed so as to be operable to prevent creation of dust during mounting; and
   an individually mountable medical storage module adapted to be mounted to said wall and to receive medical supplies, said individually mountable medical storage module comprising a storage module housing and a door which opens to allow access within said storage module housing, said storage module housing defining a plurality of mating storage module openings, which align with at least one of said plurality of monitor module openings or at least one of said plurality of CPU module openings when said individually mountable medical storage module is mounted to said wall.

2. The wall mounted modular workstation of claim 1, further comprising a plurality of substantially identically shaped flat top module elements which form said upper side and said lower side of said monitor module housing, and said upper side and said lower side of said CPU module housing, and at least on a lower side of said medical storage module housing, respective of said substantially identically shaped flat top module elements defining said defining said monitor module openings, said CPU module openings, and said storage module openings.

3. The wall mounted modular workstation system of claim 1, further comprising:
   a first plurality of interlocking members adapted to be mounted to said wall; and
   a second plurality of interlocking members which mate to said first plurality of interlocking members and are secured to said keyboard and monitor module, said CPU module, and said medical storage module, whereby said first plurality of interlocking members are securable to said second plurality of interlocking members to allow individual mounting of said keyboard and monitor module, said CPU module, and said medical storage module.

4. The wall mounted modular workstation system of claim 3, wherein said second plurality of mating interlocking members are elongate and are mounted in a horizontal orientation.

5. The wall mounted modular workstation system of claim 1, wherein said monitor module housing and said CPU module housing each comprise vertical sides which define a plurality of vents therein.

6. The wall mounted modular workstation system of claim 5, wherein said upper side and said lower side of said CPU module housing and said upper side and said lower side of said monitor module housing comprise a flat horizontal surface with a length that extends outside of said vertical sides.

7. The wall mounted modular workstation system of claim 1, further comprising a pivotal mounting operable to support pivotal movement of said keyboard and monitor module about a vertical axis.

8. The wall mounted modular workstation system of claim 7 further comprising a frame sized to selectively carry any one or all of said individually mountable keyboard and monitor module, said individually mountable CPU module, and said individually mountable medical storage module.

9. The wall mounted modular workstation system of claim 8, further comprising a plurality of rails secured to said frame, a plurality of fasteners for said rails which permit positioning and fastening of said individually mountable keyboard and monitor module, said individually mountable CPU module, and said individually mountable medical storage module in a plurality of positions.

10. A method for making a wall mounted modular workstation system, comprising:
   adapting a keyboard and monitor module to receive a keyboard and a monitor and to be individually mounted to said wall;
   providing that said individually mountable keyboard and monitor module comprises a monitor module housing and a fold-down keyboard support pivotally mounted to said monitor module housing, which allows access to said keyboard and monitor when folded down and prevents access when closed;
   making said monitor module housing with an upper side and a lower side that define a plurality of monitor module openings, which are adapted for electrical cables and ventilation and which are preformed to prevent formation of dust during installation;
   adapting a CPU module to receive a CPU and to be individually mountable to said wall;
   providing that said individually mountable CPU module comprises a CPU module housing;
   making said CPU module housing with an upper side and a lower side that define a plurality of mating CPU module openings, which align with said available monitor module openings in said monitor module housing when said individually mountable keyboard and monitor module and said individually mountable CPU module are mounted to said wall with said individually mountable keyboard and monitor module either above or below said individually mountable CPU module;

adapting a storage module to be mounted to said wall for receiving supplies;

providing that said individually mountable storage module comprises a storage module housing and a door which opens to allow access within said storage module housing; and making said storage module housing with a plurality of mating storage module openings which align with at least one of said plurality of monitor module openings or at least one of said plurality of CPU module openings when said individually mountable storage module is mounted to said wall.

11. The wall mounted modular workstation of claim 10, further providing a plurality of substantially identically shaped flat top module elements which form said upper side and said lower side of said monitor module housing, and said upper side and said lower side of said CPU module housing, and at least on a lower side of said medical storage module housing.

12. The method of claim 10, further comprising:

providing a first plurality of interlocking members adapted to be mounted to said wall; and securing a second plurality of mating interlocking members to one or more of said keyboard and monitor module, said CPU module, and said storage module, whereby said first plurality of interlocking members are securable to said second plurality of interlocking members to allow individual mounting of said keyboard and monitor module, said CPU module, and said storage module.

13. The method of claim 12, further comprising providing that said second plurality of mating interlocking members are elongate and are mounted in a horizontal orientation.

14. The method of claim 10, further comprising making said monitor module housing and said CPU module housing with vertical sides that define a plurality of vents.

15. The method of claim 14, further comprising providing that said upper side and said lower side of said CPU module housing and said upper side and said lower side of said monitor module housing each comprise a flat horizontal surface with a length that extends away from vertical sides.

16. The method of claim 10, further comprising pivotally mounting said keyboard and monitor module for pivotal movement around a vertical axis.

17. The method of claim 16 further comprising providing a frame sized to selectively carry any one or all of said individually mountable keyboard and monitor module, said individually mountable CPU module, and said individually mountable storage module.

18. The method of claim 17, further comprising securing a plurality of rails to said frame, and further providing a plurality of fasteners for said rails which permit positioning and fastening of said individually mountable keyboard and monitor module, said individually mountable CPU module, and said individually mountable storage module in a plurality of positions.

19. A wall mounted modular workstation system which mounts to a wall, comprising:

an individually mountable keyboard and monitor module adapted to be mounted to said wall and to receive a keyboard and a monitor, said individually mountable keyboard and monitor module comprising a monitor module housing and a fold-down keyboard support pivotally mounted to said monitor module housing to allow access to said keyboard and monitor when folded down and to prevent access when closed, said fold-down keyboard support being pivotal about a horizontal axis; an individually mountable CPU module adapted to be mounted to said wall and to receive a CPU, said individually mountable CPU module comprising a CPU module housing, said CPU module housing comprising an upper side and a lower side which define a plurality of mating CPU module openings which align with available monitor module openings in said monitor module housing when said individually mountable keyboard and monitor module and said individually mountable CPU module are mounted to said wall with said individually mountable keyboard and monitor module either above or below said individually mountable CPU module; an individually mountable medical storage module adapted to be mounted to said wall and to receive medical supplies, said individually mountable medical storage module comprising a storage module housing and a door which opens to allow access within said storage module housing; and a frame sized to selectively carry any one or all of said individually mountable keyboard and monitor module, said individually mountable CPU module, and said individually mountable medical storage module.

20. The wall mounted modular workstation system of claim 1, further comprising a pivotal mounting operable to support pivotal movement of said keyboard and monitor module about a vertical axis.

\* \* \* \* \*